United States Patent
Baumann et al.

(10) Patent No.: US 9,275,747 B2
(45) Date of Patent: Mar. 1, 2016

(54) INTEGRATED CIRCUIT WITH AUTOMATIC TOTAL IONIZING DOSE (TID) EXPOSURE DEACTIVATION

(75) Inventors: Robert Christopher Baumann, Dallas, TX (US); John Michael Carulli, Jr., Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 902 days.

(21) Appl. No.: 13/517,730

(22) Filed: Jun. 14, 2012

(65) Prior Publication Data

US 2013/0334897 A1    Dec. 19, 2013

(51) Int. Cl.
| | |
|---|---|
| *H01H 35/00* | (2006.01) |
| *H01H 83/00* | (2006.01) |
| *G11C 16/26* | (2006.01) |
| *G11C 16/22* | (2006.01) |
| *G11C 7/24* | (2006.01) |
| *G11C 8/20* | (2006.01) |

(52) U.S. Cl.
CPC .......... *G11C 16/26* (2013.01); *G11C 7/24* (2013.01); *G11C 8/20* (2013.01); *G11C 16/22* (2013.01); *Y10T 307/729* (2015.04); *Y10T 307/766* (2015.04); *Y10T 307/832* (2015.04); *Y10T 307/858* (2015.04)

(58) Field of Classification Search
CPC ........... Y10T 307/729; Y10T 307/766; Y10T 307/832; Y10T 307/858
USPC ....................... 307/116, 126, 130; 250/370.01
See application file for complete search history.

(56) References Cited

U.S. PATENT DOCUMENTS

| | | | |
|---|---|---|---|
| 6,441,440 B1 | 8/2002 | Brady et al. | |
| 7,880,340 B2 | 2/2011 | Miller | |
| 2004/0227093 A1* | 11/2004 | Klassen et al. | 250/370.01 |
| 2006/0028229 A1 | 2/2006 | Subramaniam et al. | |
| 2006/0107094 A1 | 5/2006 | Anderson et al. | |
| 2006/0150128 A1 | 7/2006 | Zhu et al. | |
| 2007/0157349 A1 | 7/2007 | Zhu et al. | |
| 2008/0262793 A1 | 10/2008 | Subramaniam et al. | |
| 2009/0210830 A1 | 8/2009 | Butler et al. | |
| 2011/0071782 A1 | 3/2011 | Nahar et al. | |

\* cited by examiner

*Primary Examiner* — Carlos Amaya
(74) *Attorney, Agent, or Firm* — Jacqueline J. Garner; Frank D. Cimino

(57) ABSTRACT

Integrated circuits and methods for deactivating user circuit operation with one or more wide channel sensing transistors biased to an on condition for exposure to total ionizing dose and then to an off condition for measurement and comparison of a leakage current or threshold voltage parameter to a predetermined reference, and a deactivation circuit selectively disables operation of the user circuit if the sensed parameter is greater than or equal to the reference.

26 Claims, 12 Drawing Sheets

INTEGRATED CIRCUIT WITH AUTOMATIC TOTAL IONIZING DOSE (TID) EXPOSURE DEACTIVATION

FIELD OF THE INVENTION

The present disclosure relates to the field of integrated circuits, and more particularly to integrated circuits with automatic total ionizing dose (TID) exposure deactivation.

BACKGROUND OF THE INVENTION

Continuing performance improvements and scaling of semiconductor devices has generally resulted in operational capabilities in excess of minimum requirements for extraterrestrial applications such as satellites in which higher levels of radiation are experienced. However, devices capable of operating in high radiation environments may be subject to usage regulations established for satellite operation, such as International Traffic in Arms Regulations (ITAR), despite being designed for other uses. Such radiation hardened (rad-hard) products are typically regulated if they satisfy all performance criteria set forth in the ITAR regulations. One ITAR criteria relates to total ionizing dose (TID) which is characterized in terms of cumulative absorbed dose as a measure of deposited ionizing radiation energy per unit mass, such as joules per kilogram or rads. Commercializing potentially rad-hard devices in certain countries may involve obtaining export licenses or costly product testing and sorting to verify unsuitability for satellite operation, and such costs may inhibit the ability to export such products. Accordingly, improved integrated circuit designs and methods are desirable to ensure that ordinary products designed for non-satellite usage do not qualify for export restrictions per ITAR regulations.

SUMMARY OF THE INVENTION

Various aspects of the present disclosure are now summarized for compliance with 37 CFR §1.73 to facilitate a basic understanding of the disclosure by briefly indicating the nature and substance of the disclosure, wherein this summary is not an extensive overview of the disclosure, and is intended neither to identify certain elements of the disclosure, nor to delineate the scope thereof. Rather, the primary purpose of this summary is to present some concepts of the disclosure in a simplified form prior to the more detailed description that is presented hereinafter, and this summary is submitted with the understanding that it will not be used to interpret or limit the scope or meaning of the claims. Various concepts of the present disclosure provide integrated circuits (ICs) and methods by which semiconductor devices not intended for satellite uses are rendered nonfunctional when subjected to specified amounts of total ionizing dose (TID), and are thus insured to be compliant with corresponding regulations such as ITAR.

Disclosed embodiments of an integrated circuit include a sensing circuit with one or more sensing transistors, as well as a controller which disconnects the sensing transistor(s) from the sensing circuit and biases them (e.g., "on") in a first (exposure) mode and biases the sensing transistor(s) off in a second mode for measurement by the comparator circuit. A deactivation circuit receives the output of the comparator and selectively disables user circuitry of the IC in response to a comparator signal indicating that the total ionizing dose (TID) experienced by the integrated circuit meets or exceeds a threshold value.

In certain embodiments, the controller alternates between the first mode and the second mode periodically, such as at a frequency tailored to the speed at which a detectable sensing transistor parameter shifts as a function of received dose. An advantage of certain embodiments of the disclosed integrated circuit is the ability to facilitate exposure to total ionizing dose during an exposure mode with the sensing transistor(s) biased to an on condition, and then to subsequently facilitate measurement of sensing transistor leakage current, threshold voltage (Vt), etc. in a second mode. For instance, in certain embodiments, NMOS sensing transistors are turned on during the first mode, with the controller applying a positive supply voltage to the transistor gate while grounding the source and drain, and then facilitating subsequent measurement in the second mode by applying a positive supply voltage to the drain while grounding the gate and connecting the source to an input of the comparator circuitry.

The sensing circuit in certain embodiments includes an isolation structure alongside the source or drain of the sensing transistor(s), and the controller biases a well along another side of the isolation structure for sensing leakage current between the well and the sensing transistor for TID detection. In certain embodiments, moreover, an electrode is formed above all or a portion of the sensing isolation structure and the controller biases the electrode during the exposure mode to enhance charge collection from the TID source and/or during the measurement mode to enhance the level of leakage current.

In certain embodiments, two or more sensing transistors are provided for receiving total ionizing dose and for measurement of one or more operating parameters by the comparator circuit. In certain embodiments, moreover, the comparator reference circuitry can be designed to be robust to TID and/or may be preferably powered off during the first (exposure) mode. For instance, first and second PMOS transistors may be used for the comparator reference, with a source or drain of the first PMOS transistor coupled to the comparator circuit through a pass gate to use a sensed parameter of the PMOS transistors as a reference signal. The PMOS transistors are separated by an isolation structure, such as a shallow trench isolation (STI) structure, a field oxide, LOCOS structure, etc., and the controller applies a bias to a source or drain of the second PMOS transistor to allow the comparator circuit to sense a leakage current from the first PMOS transistor to the second PMOS transistor. Other embodiments are possible in which annular layouts can be used in constructing the reference circuitry to reduce the sensitivity to TID exposure, while longitudinal layouts are used for the transistors and other TID-sensing components of the sensing circuitry, and the reference circuitry is preferably powered down during the exposure mode.

Embodiments may include an adjustable reference, fuses, anti-fuses, and/or multiple pass gates operated by the controller to selectively connect less than all of the sensing transistors to the comparator during measurement, whereby the detection sensitivity can be tailored for specific products and/or specific TID thresholds. Further aspects of the present disclosure provide methods for operating an integrated circuit, including biasing one or more sensing transistors to an on condition during an exposure time period, biasing the sensing transistor(s) to an off condition during a measurement time period, sensing a parameter of the transistor during the measurement time period, and selectively disabling operation of the user circuitry if the sensed parameter is greater than or equal to a predetermined reference.

DESCRIPTION OF THE VIEWS OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
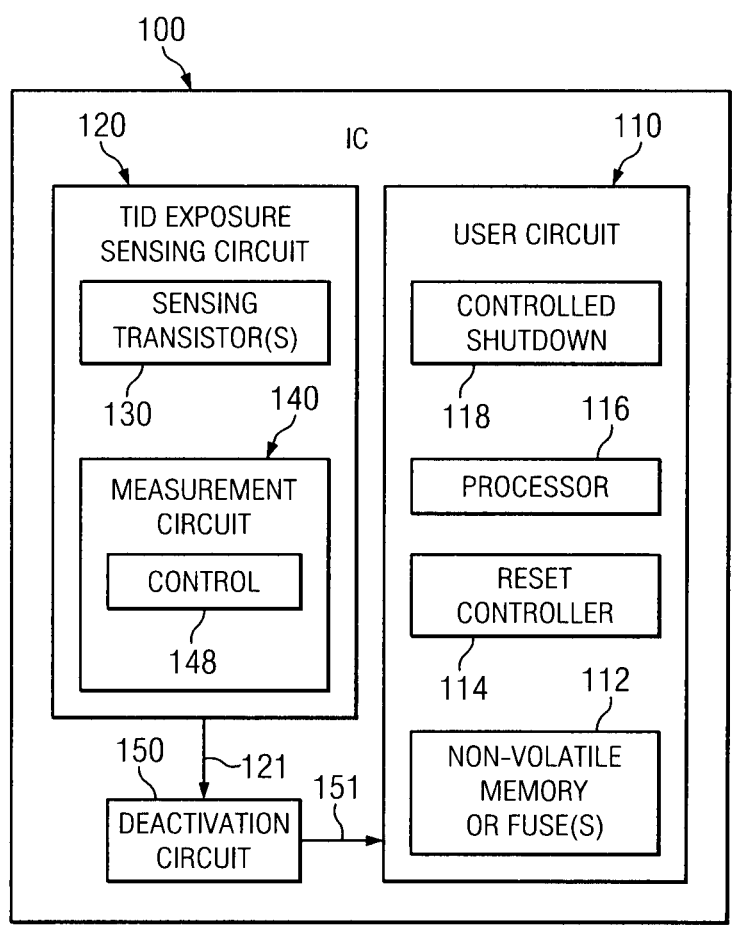
FIG. 1 is a simplified top plan view of an integrated circuit with a TID exposure sensing circuit including one or more sensing transistors and a dual mode measurement circuit providing a signal to a deactivation circuit for selective shutdown of user circuitry in accordance with one or more aspects of the disclosure.

One or more embodiments or implementations are hereinafter described in conjunction with the drawings, wherein like reference numerals are used to refer to like elements throughout, and wherein the various features are not necessarily drawn to scale.

FIG. 1 illustrates an integrated circuit (IC) embodiment 100 in accordance with certain aspects of the present disclosure. The IC 100 can be any form of integrated circuit, comprised of one or more types of user circuits 110 including without limitation power circuits, digital circuitry, analog circuitry, electronic memory, digital signal processing (DSP) circuitry, and/or programmable logic, etc. The user circuit 110 in FIG. 1 includes non-volatile memory (e.g., ferroelectric random access memory or FRAM), fuses and/or anti-fuses 112 as well as a processor 116 with a reset controller 114 and controlled shutdown programming or logic 118. The IC 100 further includes a total ionizing dose (TID) exposure sensing circuit 120 including one or more sensing transistors 130 and a measurement circuit 140 including a dual-mode controller 148. The sensing circuit 120 provides an output signal 121 to a deactivation circuit 150, which provides one or more output signals 151 to the user circuit 110 in order to selectively disable or deactivate the user circuit 110.

Figure 2:
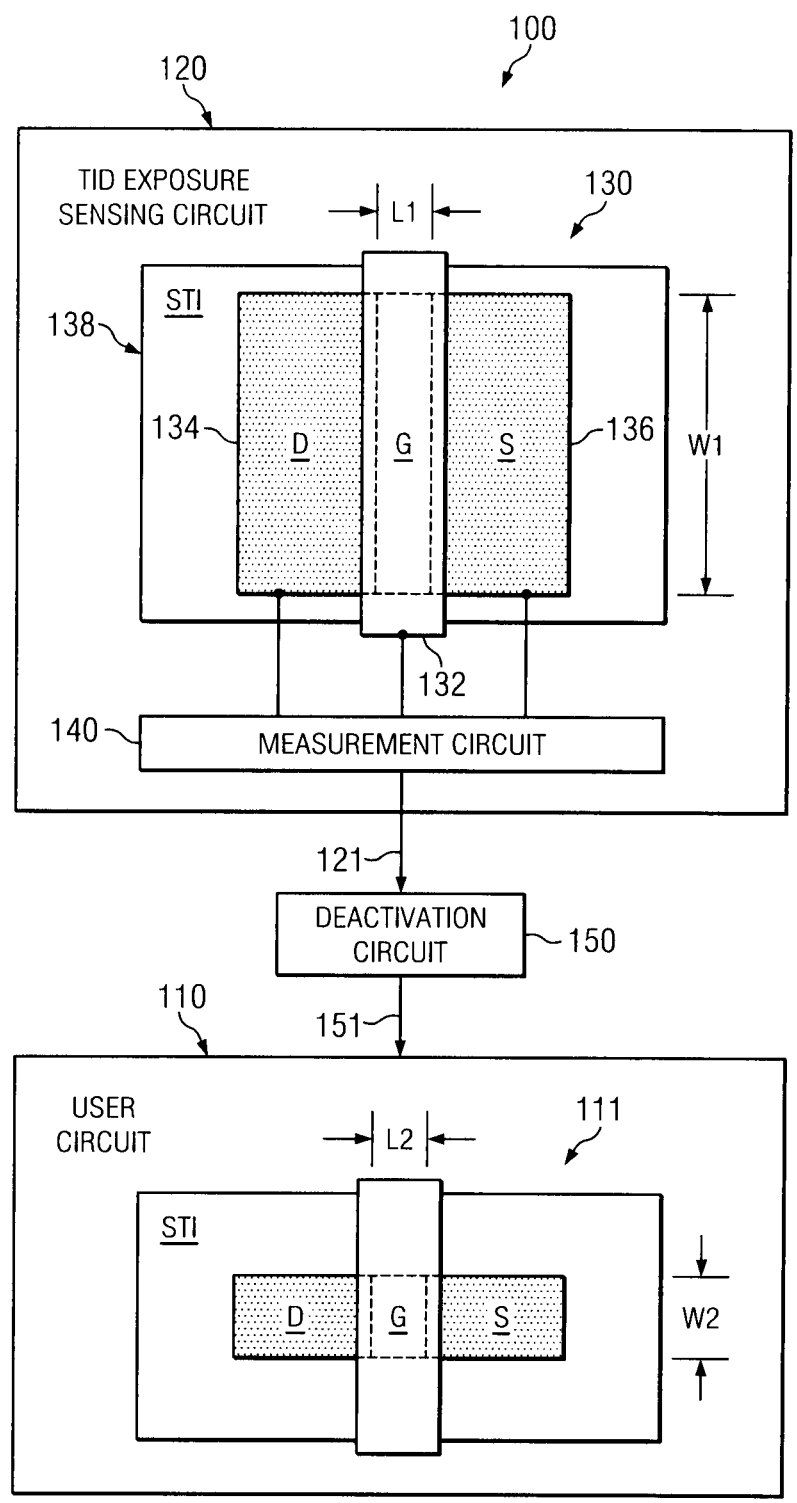
FIG. 2 is a simplified partial top plan view of the integrated circuit of FIG. 1 illustrating an exemplary wide-channel transistor in a TID exposure sensing circuit and a narrower-channel transistor in the user circuitry.

FIG. 2 illustrates an exemplary sensing transistor 130 in the TID exposure sensing circuit 120, which is an NMOS in the instant embodiment. Other embodiments are possible in which one or more different types of sensing transistors 130 can be employed, including without limitation PMOS transistors, NPN or PNP bipolar transistors, etc. The NMOS sensing transistor 130 in FIG. 2 includes a gate structure 132 formed at least partially over a channel region defined between a drain region 134 (D) and a source region 136 (S) surrounded by an isolation region 138 which can be formed using any suitable isolation structure fabrication technique such as LOCOS or shallow trench isolation (STI). The sensing transistor 130 is preferably formed in a semiconductor body such as a silicon material or a silicon-on-insulator (SOI) structure with suitable doped wells and doped regions forming the drain 134, the source 136 and the channel. The channel of the illustrated sensing transistor 130 has a channel length L1 and a channel width W1. The gate 132, drain 134 and source 136 are electrically connected to a measurement circuit 140 which provides an output signal 121 to the deactivation circuit 150. As seen in FIG. 2, moreover, the user circuit 110 includes one or more user transistors 111 (a MOS transistor 111 is illustrated as an example), where the user circuitry 110 includes transistors having a maximum channel length L2 and a maximum channel width W2, where the width W1 of the sensing transistor 130 in certain embodiments is greater than the width W2 of the user transistors 111 (W1>W2).

In certain embodiments, the sensing transistor 130 is preferably a wide-channel design, having a channel width W1 significantly larger than that of any of the user transistors 111. The channel width W1 is preferably large enough to provide sufficient signal level for comparison with a reference in the measurement circuitry 140 to ascertain exposure of the IC 100 to a TID level of interest. In certain embodiments, for instance, the channel width W1 may be greater than about 0.2 μm. In some embodiments, W1 can be about 0.25 μm or more, and W1 can be about 0.30 μm or more in further embodiments, where the channel width W1 of the sensing transistor(s) 130 may be set at or near a maximum width set by applicable manufacturing design rules. Where a single sensing transistor 130 is used, the channel width W1 and other transistor dimensions and design parameters may be set such that adequate signal level is provided for comparison with a reference in the measurement circuitry 140 to detect transition above a given TID value of interest. In this regard, as further described below in connection with FIGS. 9 and 10, wide channel sensing transistors 130 with sensing isolation structures 138 formed along a sensing transistor source or drain may exhibit high sensitivity to TID by charge accumulation in the isolation structure 138, and therefore constitute suitable sensing circuitry 130. For instance, ITAR regulations may apply for devices operable above a level of 500 Krads, and a detection threshold may be set there or somewhere below, such as between about 200 and 300 Krads in order to ensure the IC 100 will not operate when the threshold amount of TID has been received. Moreover, as discussed further below, in certain embodiments, the deactivation circuit 150 may initiate a controlled shutdown of the user circuitry 110 according to shutdown programming or logic 118 (FIG. 1) to provide a certain number of processor cycles for safe shutdown of the IC 100 in a given application, with the detection threshold being set below a critical level (e.g., low 500 Krads) to ensure that ITAR specifications have not been met even though the IC 100 undergoes a controlled shutdown before becoming permanently rendered inoperable.

Figure 3:
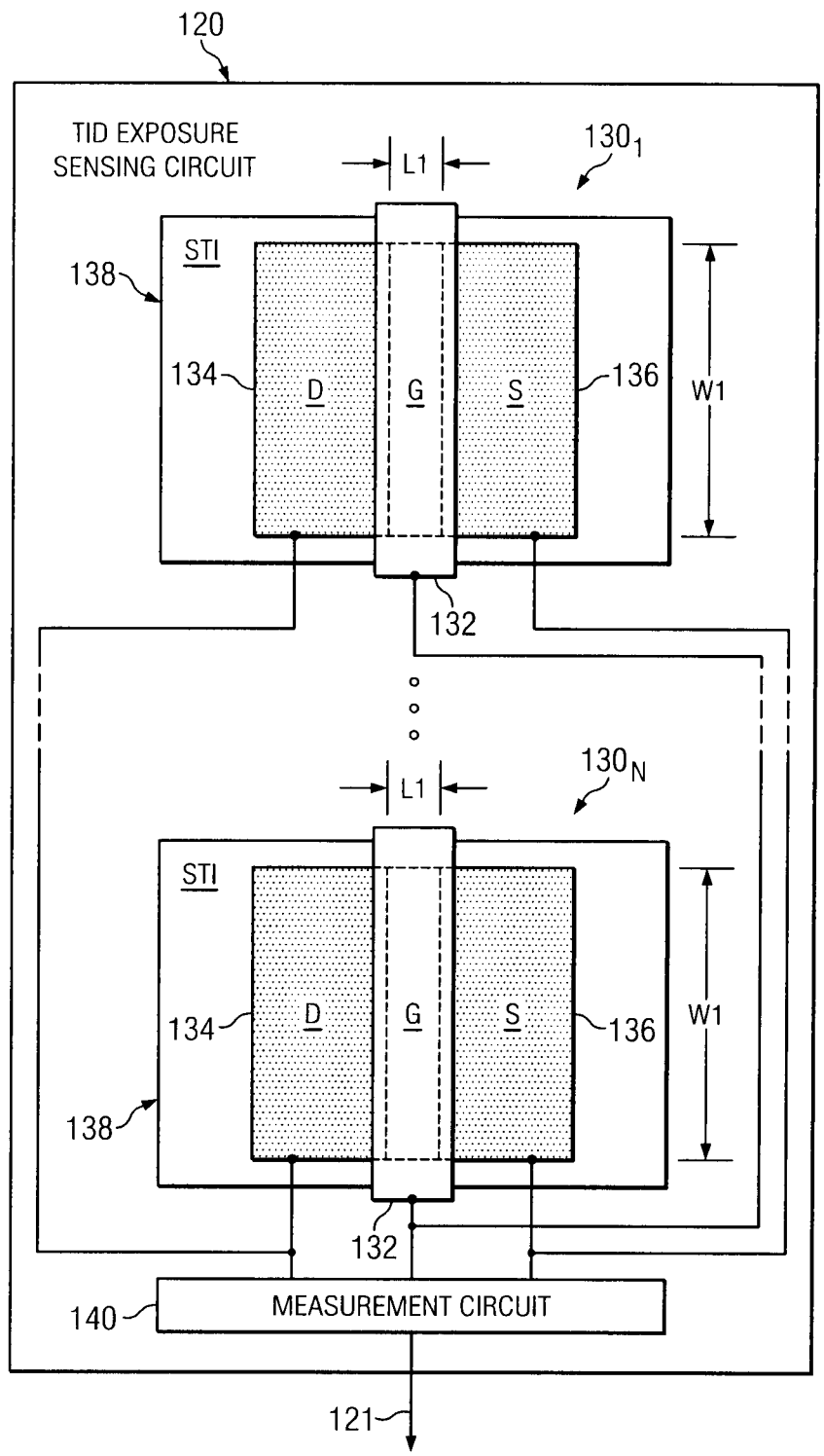
FIG. 3 is a simplified partial top plan view illustrating another embodiment of the integrated circuit of FIG. 1 including a plurality of sensing transistors coupled with a measurement circuit.

As seen in FIG. 3, certain embodiments may include multiple sensing transistors 130, which may be coupled together in any suitable fashion, such as parallel connection as illustrated. In other embodiments, multiple sensing transistors 130 can be connected together in any suitable series and/or parallel combinations, and groups of sensing transistors 130 can be interconnected with other groups of sensing transistors 130 in order to allow measurement of one or more operational parameters thereof via the measurement circuitry 140. In the example of FIG. 3, the sensing transistors 130 are connected in parallel with one another, with the gates 132 being connected together, the drains 134 being connected together, and with the sources 136 being connected together, all of which being coupled electrically to the measurement circuit 140. Any suitable conductive structures can be used for interconnecting the terminals of the multiple sensing transistors 130, such as using suitable contacts and metallization layers (not shown) in the fabrication of the IC 100. In one possible implementation, a common gate structure 132 can be formed for all of the sensing transistors 130 or groups of two or more of the sensing transistors 130 can share a common gate structure 132.

Figure 4:
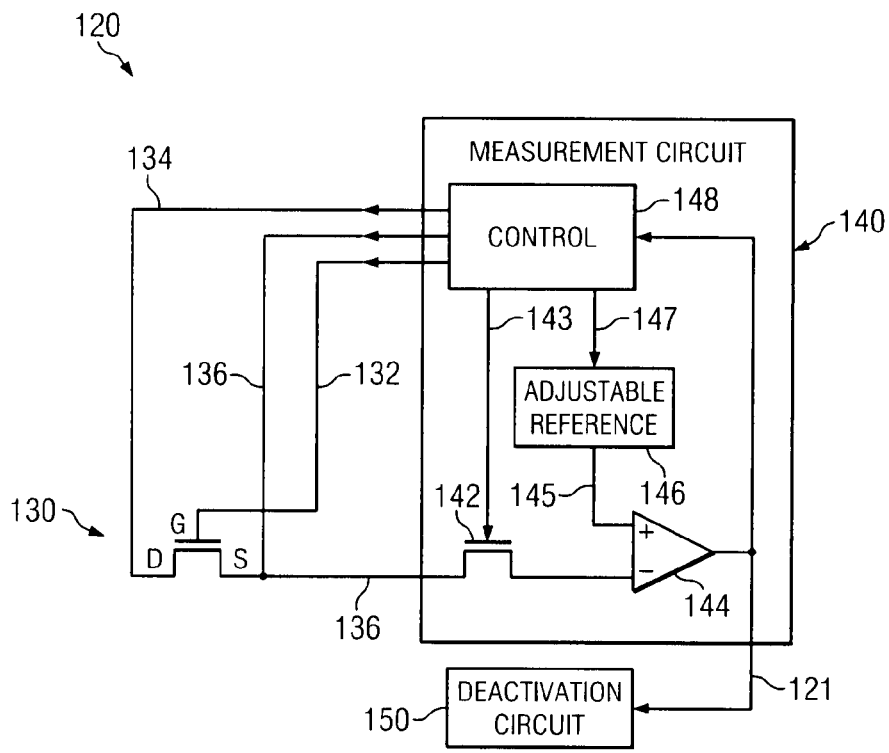
FIG. 4 is a schematic diagram illustrating an exemplary embodiment including a single TID sensing transistor and a measurement circuit with a dual mode controller and an adjustable reference.
Figure 5:
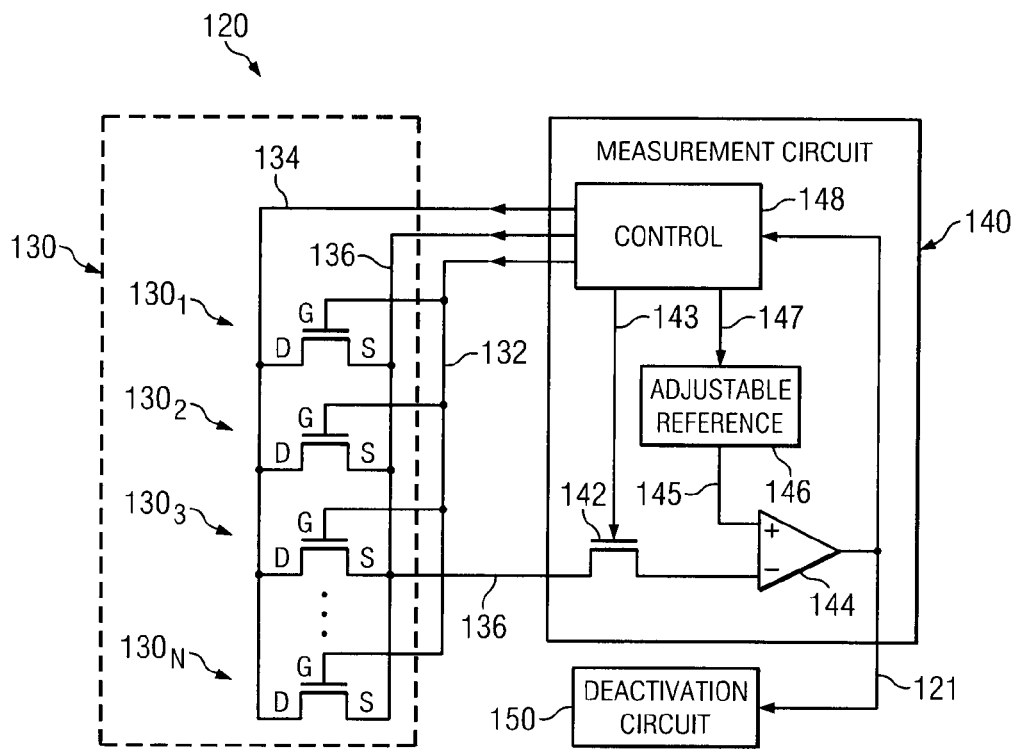
FIG. 5 is a schematic diagram illustrating an embodiment of a sensing circuit with a plurality of sensing transistors.

Referring to FIGS. 4 and 5, FIG. 4 illustrates an embodiment with a single NMOS sensing transistor 130, and FIG. 5 illustrates an embodiment in which an integer number N sensing transistors $130_1$, $130_2$, $130_3$ ... $130_N$ are coupled in parallel and the array of sensing transistors 130 is electrically connected to a controller or control circuit 148 and to a shared pass gate 142 of a measurement circuit 140. In these embodiments, the measurement circuit 140 also includes a comparator circuit 144, which can be a current comparator or a voltage comparator with suitable sensing resistors (not shown) in certain embodiments. The comparator circuit 144 includes a first input terminal (non-inverting or "+") connected to receive a reference signal (e.g., current or voltage) 145 from an adjustable reference 146, as well as a second (inverting or "−") input coupled to the sources 136 of the sensing transistors 130 via the pass gate 142. The controller 148, moreover, may be configured to provide a control or adjustment signal or value 147 to the adjustable reference 146, and may receive a comparator output signal 121 from the comparator circuit 144, although not strict requirements of all possible embodiments of the present disclosure.

The reference circuit 146 in certain embodiments can be a standard voltage or current source circuit with a resistance, and the reference circuitry 146 and other non-sensing circuitry (e.g., the comparator 144, pass gate 142, controller 148, deactivation circuit 150, etc.) can be constructed so as to be largely unaffected by total ionizing dose (e.g., rad-hard), and the reference 146 and/or the comparator 144 are preferably powered down during the first (exposure) operational mode of the controller 148. For instance, transistors and other components of the pass gate 142, comparator 144 and the reference circuit 146 may be designed to be rad-hard by annular design techniques, such as concentrically configured source and drain, with a circular gate, by which the gate region has little or no significant isolation structure edge. The resulting annular transistor structure is therefore largely immune to isolation structure-related TID sensitivity associated with longitudinal designs.

The controller 148 can be any suitable control circuitry, which may be programmable logic and/or analog circuits capable of providing control signals and applying supply voltages in first and second modes. For example, in the embodiments of FIGS. 4 and 5, the controller 148 can selectively provide a gate control signal 143 to turn the pass gate 142 on (conductive) or off (non-conductive), and the controller 148 can also selectively couple the gate 132, drain 134 and/or source 136 of the sensing transistors 130 to one or more power supply voltages, such as a positive supply voltage, a negative supply voltage, ground, and/or to an adjustable voltage. The controller 148 in this embodiment provides dual-mode operation for alternately biasing the sensing transistors 130 into an on state while turning the pass gate 142 off (nonconductive) in a first operational mode. For instance, in the illustrated embodiments using one or more NMOS sensing transistors 130, the controller 148 couples the gates 132 to a positive supply voltage while grounding the drains 134 and the sources 136 in the first mode (e.g., exposure mode) to facilitate total ionizing dose exposure of the sensing transistors 130 while turning the pass gate 142 off. In this regard, turning the pass gate 142 off during the first mode advantageously prevents or inhibits TID effects on the pass gate 142 itself. In addition, normal operation of the user circuitry 110 continues while the controller 148 is in the first mode. In other embodiments, moreover, pass gates can be provided at both inputs to the comparator 144, preferably of identical or similar construction (e.g., NMOS pass gates for embodiment similar to those of FIGS. 4 and 5), with the gate controls for the pass gates 142 preferably being operated in similar fashion to be an "off" state or condition during the first mode of operation of the controller 148, such that radiation exposure of the integrated circuit 100 affects both such pass gates 142 substantially identically, whereby a shift in the pass gate 142 providing the sensing circuit signal 136 to the comparator 144 is effectively canceled or offset by any shift in the pass gate (not shown) coupling the reference signal 145 to the comparator 144.

In this regard, the "on" state of the sensing transistor(s) 130 facilitates absorption or accumulation of incident ions, particularly along the edges of the STI isolation regions 138 and/or also in the gate dielectric of the sensing transistor 130, whereby the sensing circuit 130 is rendered more sensitive or susceptible to TID, and is therefore better able to function for the purpose of detecting the total ionizing dose experienced by the integrated circuit 100 as a whole. With respect to ionic accumulation in the gate dielectric, positive gate bias will cause electrons generated in the gate oxide layer to be collected while forcing holes close to the Si—$SiO_2$ interface, thereby shifting the threshold voltage of the sensing transistor 130. In this regard, positive charge in an NMOS gate will reduce the threshold voltage by attracting additional electrons to the channel, thereby making the NMOS leakage increase with TID exposure. Biasing the gate positive during exposure may enhance this detection mechanism. Separately, or in combination, isolation structures can provided which are sensitive to TID exposure. For instance STI or other isolation structures adjacent to the sensing transistor 130 may be used to detect a TID exposure, wherein the advantageous use of one or more wide-channel sensing transistors (large W1) 130 also facilitates providing adequate signal output to the comparator circuit 144, particularly for leakage current or Vt measurements, to allow reliable detection of transitions in the sensed parameter correlated to TID levels in terms of Krads or other suitable units.

Thus, the sensing circuitry 130, and in particular the transistor features most susceptible to leakage path enhancement through TID exposure (NMOS gate dielectric, isolation structure alongside sensing transistor source or drain, etc.) is preferably biased during exposure mode to enhance charge accumulation therein. In certain embodiments, moreover, as much as possible of the remaining TID exposure sensing circuitry 120, including the reference circuit 146, is preferably turned off during the exposure mode so as to mitigate circuit shifts associated with TID charge accumulation. This concept may be employed alone and/or in combination with the use of reference circuitry (e.g. comparator reference 146) that is either powered down during the exposure mode (to minimize TID charge accumulation) and/or which is constructed such that the effect of any TID exposure is of a different polarity, such as the use of PMOS reference transistors illustrated and described below in connection with FIG. 14. In certain embodiments, a standard voltage or current source with a resistor can be used to construct the comparator reference circuit 146, and these components may be designed to be radiation hardened or "rad-hard" and/or may be powered down during the exposure mode and/or may be otherwise designed and operated so that little or no shift results from TID exposure. In certain embodiments, moreover, transistors of the reference circuit 146 can preferably be made using annular layouts so as to be robust with respect to TID exposure.

In a second (measurement) mode, the controller 148 biases the sensing transistor(s) 130 for measurement of one or more operating parameters. In the illustrated embodiment, the sensing transistor(s) is/are biased to an off state in the second mode for leakage current measurement. In addition, the controller 148 turns the past gate 142 on (conductive) to couple the sensing transistor source terminals 136 with the inverting input of the comparator circuit 144 in the second mode. In addition, if a pass gate (not shown) is provided between the reference 146 and the other input of the comparator circuit 144, the controller 148 turns such an additional pass gate on during the second mode. In the case of NMOS sensing transistors 130, the controller 148 couples the sensing transistor drains 134 with the positive supply voltage while grounding the gates 132 to facilitate sensing off-state leakage current of the sensing transistor(s) 130. In certain embodiments, the controller 148 may perform other biasing of the gates 132, drains 134 and/or sources 136 for measuring other operating parameters, such as characterizing a threshold voltage of the sensing transistors 130 by applying a positive voltage to the drains 134 and selectively applying different gate voltages 132 to measure the drain-source current $I_{DS}$ as a function of the gate voltage $V_{GS}$. Other biasing operations can be done for measuring other sensing transistor operating parameters that vary as a function of TID for MOS, bipolar, or other forms of sensing transistors 130.

By this dual-mode operation, the controller 148 advantageously provides a first mode or state in which TID exposure affects on the sensing transistor(s) 130 is optimized, for instance, by biasing the sensing transistor(s) 130 in an on state, and then providing different biasing in a second mode or state for measurement of one or more operating characteristics of the sensing transistors 130 to ascertain the extent of TID exposure. In certain embodiments, moreover, the controller 148 operates to alternate between the first mode and the second mode periodically. For instance, the first mode can be a default operating mode (during which normal operation of the user circuitry 110 continues), with the controller 148 entering the second mode periodically to perform TID exposure measurements, where the sampling frequency in practice may be fairly low thereby minimizing process overhead associated with the measurement operations, with the measurements being performed often enough to ensure that changes in sensed operating parameters can be detected for selective deactivation of the user circuitry 110 of the IC 100.

As further seen in FIGS. 4 and 5, the comparator circuit 144 provides an output signal 121 to the deactivation circuit 150 based on comparison of the signal from the sensing transistor source(s) 136 with a signal 145 from an adjustable reference 146. In certain embodiments, the comparator circuit 144 directly compares a measured sensing transistor leakage current via the pass gate 142 with a reference current signal 145 from the reference circuit 146 (directly or through an intervening pass gate (not shown) in certain embodiments). In other embodiments, the comparator circuit 144 can be a voltage comparator or equivalent circuit with suitable resistances to provide a voltage at the inverting input representative of the sensing transistor leakage current, with the reference circuit 146 providing a voltage reference signal 145 for the comparison, whether directly or through an intervening pass gate (not shown) in the reference signal path to the comparator input. The comparator circuit 144, moreover, may provide a dual level output signal 121 with one level indicating that the sensed parameter of the transistors 130 is greater than or equal to the output of the reference 146, or suitable output circuitry may be provided so as to generate a pulse output or other suitable output signal 121 in response to the sensed parameter meeting or exceeding the reference 146.

In other embodiments, the controller may bias the sensing transistors 130 for measurement of a threshold voltage or other I-V characteristic curve of the exposed sensing transistor(s) 130, with the controller 148 providing the control signal 147 to selectively adjust the reference circuit 146 to provide a comparison curve in combination with selective adjustment of a gate voltage signal 132 applied to the sensing transistors 130, with the output of the comparator circuit 144 selectively indicating whether the measure transistor current profile exceeds a threshold profile to thereby indicate TID exposure above an amount of interest.

Referring again to FIG. 1, in response to receipt of an output signal 121 from the comparator circuit 144 indicating that a sensed parameter of the sensing transistor(s) 130 is greater than or equal to the reference 146, the deactivation circuit 150 selectively disables operation of the user circuit 110. In certain embodiments, the disabling or deactivation of the user circuitry 110 is done by the deactivation circuit 150 selectively blowing a fuse or anti-fuse (or both) and/or setting one or more bits of a nonvolatile memory 112 in the user circuit 110 which thereafter renders the user circuitry 110 inoperable even if the input power is cycled to the integrated circuit 100. For instance, as seen in FIG. 1, the integrated circuit 100 may include one or more processor elements 116 with an associated reset controller circuit 114 which performs reset and start up operations contingent upon reading a predetermined logic state of a nonvolatile memory a bit or of a voltage of a circuit that includes a fuse and/or anti-fuse. In this example, the deactivation circuit 150 selectively changes the state of the nonvolatile memory bit or blows a fuse and/or anti-fuse in the circuit 112 by way of a deactivation signal 151 in response to receipt of a comparator output signal 121 indicating that the sensed parameter of the sensing transistor(s) 130 meets or exceeds the value of the output signal 145 provided by the reference 146. In this manner, the user circuitry 110 will thereafter be disabled or deactivated, even if power is discontinued and thereafter reapplied.

In other possible embodiments, the deactivation circuit 150 provides an interrupt to the processor 116 which causes the processor to implement a controlled shutdown program or routine 118, for example allowing a certain small number of processor cycles (e.g., 1,000) in which the user circuitry 110 can be safely deactivated in response to receipt of a signal 121 from the comparator circuit 144. In this case, the controlled shutdown routine 118 may include changing a bit in the nonvolatile memory or blowing a fuse and/or anti-fuse 112 such that the user circuitry 110 is thereafter deactivated. In other possible implementations, the signal 151 from the deactivation circuitry 150 may change the nonvolatile memory bit and/or blow the necessary fuse and/or anti-fuse such that the user circuit 110 is thereafter disabled, in addition to providing an interrupt to cause the user circuit 110 to initiate a controlled shutdown program or routine 118. In other possible implementations, the deactivation circuit 150 provides the signal 151 to initiate disablement of one or more design blocks of the user circuitry 110, where the integrated circuit 100 could continue running, for example, providing unusable outputs. In certain examples, a memory could be disabled. In certain embodiments, provision of the deactivation signal 151 can cause disabling of any desired functionality, and may be used to turn off an output pin of the IC 100.

The deactivation circuit 150 is therefore not triggered accidently, and preferably is constructed such that it cannot be disabled by a user. In certain embodiments, the deactivation circuit 150 may be disabled in a manufacturing setting, for instance, using one or more external fuses (electrical or laser) that would allow a manufacturer to disable the circuit 150 in cases where a given integrated circuit 100 is to be sold for applications that exceed ITAR limits (high reliability applications), whereas the deactivation circuit 150 would remain enabled (disabling fuses unblown, without the ability for an end-user to disable the circuit 150) for other parts intended for customers not intending use in an ITAR environment.

In other possible implementations, the disclosed concepts can be used in integrated circuits having duplicate user circuitry 110, one powered on and another powered off at any given time. Since TID damage occurs much more slowly in unpowered circuits, the TID exposure sensing circuitry 120 described herein could be used to signal a deactivation circuit 150 to selectively shut down a first user circuit (presumably having suffered a threshold amount of TID exposure by virtue of previously being powered on), and instead turning on a second user circuit (which presumably has not suffered the threshold amount of TID-related damage). In such implementations, the detection circuit 150 may selectively transfer data, operating states, etc. between the user circuits 110 prior to transitioning operation to the second user circuit 110. In such embodiments, moreover, a second TID sensing circuit 120 could then be used to begin TID monitoring along with activation of the second user circuit 110. In this manner, the useful lifetime of the integrated circuit 100 may be extended by provision of redundant user circuits 110 and selective employment of only one at a time with TID exposure monitoring to determine the transition point.

Referring to FIGS. 4-7, any suitable reference 146 may be employed, which provides a reference signal 145 for comparison with a sensed parameter of one or more sensing transistors 130 in order to detect a TID exposure amount of interest. In certain embodiments in which a controlled shutdown operation is initiated by the deactivation circuit 150 in response to the signal 121 from the comparator 144, the reference signal 145 may be set such that the user circuit deactivation occurs prior to the sensing transistors 130 reaching a critical level of TID exposure. For instance, an ITAR threshold level of 500 Krads can be prorated to a lower TID level, such as 200-300 Krads, with the provision of a controlled shutdown operation 118 allowing a certain number of processor cycles before the user circuit 110 ceases operation, with the number of allowed shutdown processor cycles being set such that the IC 100 is ensured to be below the critical level of 500 Krads at the time the controlled shutdown routine is completed. In this regard, the reference 146 may be adjustable as shown in FIG. 5, with the controller 148 providing an adjustment input signal 147 to set the level of the comparison signal 145 provided to the non-inverting input of the comparator 144. The adjustability of the reference 146 can also be used, as discussed above, in order to implement an I-V characterization of the sensing transistor(s) 130.

Figure 6:
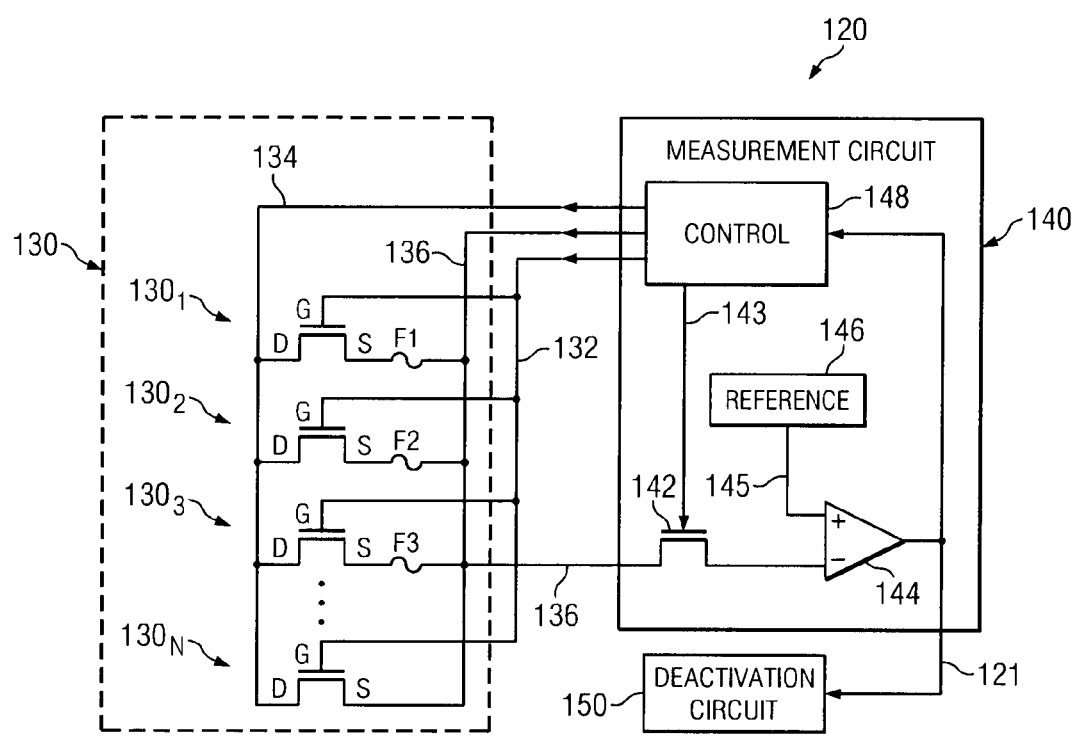
FIG. 6 is a schematic diagram illustrating another embodiment with a plurality of fuses coupled between sensing transistors and the measurement circuit.

FIG. 6 illustrates another possible embodiment in which a fixed reference 146 provides a fixed reference signal 145 (whether a voltage signal or a current signal) to the comparator 144. Such a fixed reference 146 can be used with single sensing transistor implementations or in implementations (e.g., as shown in FIG. 6) using a plurality of sensing transistors 130. In practice, the reference 146 can be designed based on empirical measurements of one or more sensed parameters of the sensing transistor(s) 130 after exposure to a TID level of interest. For instance, a test sample can be constructed which includes the sensing transistor(s) 130, and the test sample can be radiated with a certain amount of total ionic dose, such as 200 Krads in one example. One or more operating parameters, such as leakage current $I_L$, are then measured in the test sample, and a reference 146 is designed for production integrated circuits 100 which provides a comparator signal 145 commensurate with that measured for the exposed test sample.

In the embodiment of FIG. 6, moreover, a source terminal 136 of one or more of the plurality of sensing transistors 130 is connected in series with a fuse, wherein three exemplary sensing transistors $130_1$, $130_2$, and $130_3$ have their source terminals connected to the pass gate 142 through fuses F1, F2 and F3, respectively in this example. A fixed reference 146 can be used in such embodiments, where one or more of the fuses F1-F3 may be blown during production based on correlation testing of one or more test samples such that the threshold measured parameter of interest (e.g., leakage current) substantially correlates with the reference signal 145 provided to the comparator 144 when the connected sensing transistor(s) 130 is/are exposed to the TID amount of interest. This selective adjustment of the number of connected sensing transistors 130 by selective blowing of one or more fuses F1-F3 and/or anti-fuses can be used alone or in combination with design adjustment of the reference 146 as described above.

In certain implementations, two identical sensing circuits 130 could be constructed within the integrated circuit 100, with a first circuit 130 being used as a sensing circuit with power applied during the first (exposure) mode by the controller 148. The other circuit would be powered down during the first mode, thereby preventing or inhibiting charge accumulation, and would then be powered up during the second mode to act as a reference 146. As discussed further in connection with FIG. 14 below, moreover, another possible reference circuit 146 could be constructed using actively biased PMOS transistors in which exposure to TID will reduce leakage in the reference, thereby providing a higher sensitivity to TID overall.

Figure 7:
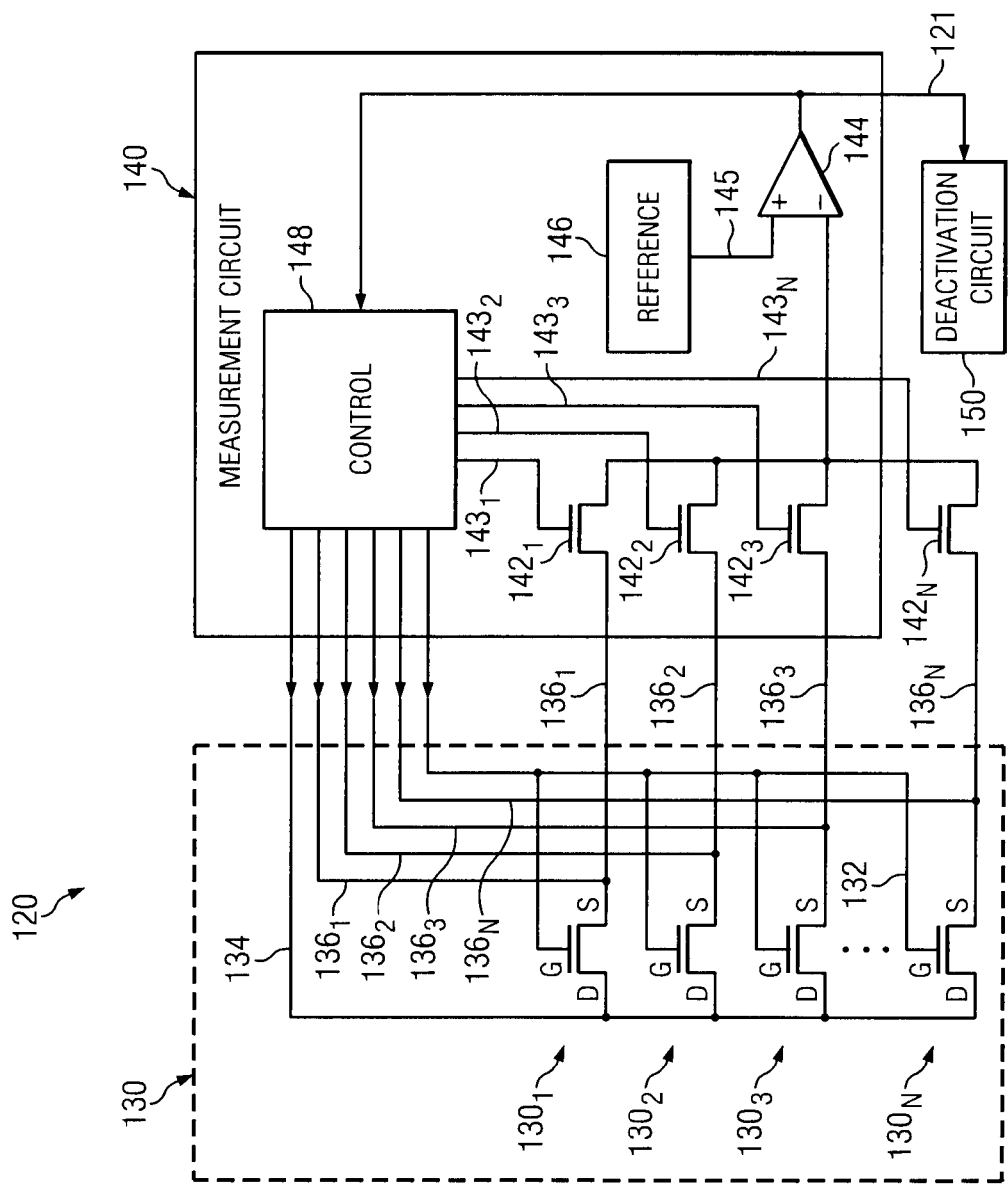
FIG. 7 is a schematic diagram illustrating yet another embodiment with a plurality of sensing transistors coupled to a comparator circuit via corresponding pass gates.

FIG. 7 illustrates another possible embodiment in which a plurality of pass gates 142 are provided, with individual pass gates 142 coupled between a source 136 of a corresponding one of the plurality of sensing transistors 130 in the inverting input terminal of the comparator circuit 144. In this case, the controller 148 provides individual control signals $136_1$-$136_N$ for grounding the source terminals of the transistors 130 during the first mode. Is issued, the controller 148 is operative in the second mode to turn on at least one of the pass gates 142 to connect the corresponding sensing transistor(s) 130 to the comparator 144 for measurement of a sensed parameter of interest. In this case, the programming of the controller 148 with respect to how many of the pass gates 142 are activated during the second mode (alone or in combination with design adjustment of the reference 146) can be based on controlled exposure and subsequent measurement of test samples such that the comparison by the measurement circuitry yields an output signal 121 providing an indication of when the exposure of the integrated circuit 100 has reached or exceeded a TID level of interest.

Figure 8:
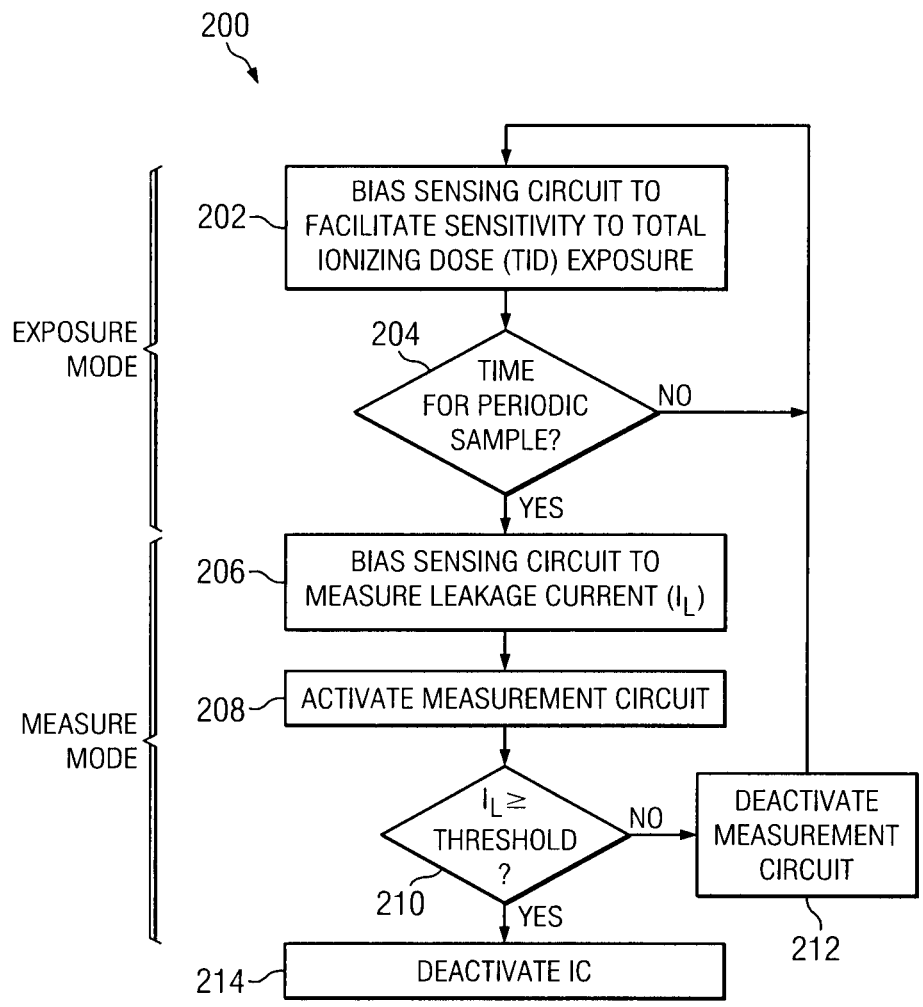
FIG. 8 is a flow diagram illustrating an exemplary method for selectively disabling user circuit operation of an integrated circuit according to further aspects of the present disclosure.

FIG. 8 illustrates an exemplary process or method 200 for operation of the integrated circuit 100, which may be implemented in the controller 148 and deactivation circuit 150 illustrated and described above. At 202, one or more sensing circuits (e.g., transistors 130 in the embodiments of FIGS. 1-7) are biased in a first or normal mode to facilitate total ionizing dose (TID) exposure. In the above-described MOS sensing transistor examples, for instance, the sensing transistor(s) 130 can be biased to an on condition to facilitate total ionizing dose exposure during an exposure time period while allowing continued operation of the user circuit 110. A determination is made at 204 as to whether a time for a periodic sample has arrived. If not, (NO at 204), the process 200 continues to bias the sensing transistors for exposure at 202. Once the time has arrived for the next periodic sample (YES at 204), a second or measure mode begins at 206 with the sensing transistor(s) being biased off to measure leakage current. A measurement circuit (e.g., measurement circuit 140 above) is activated at 208, and a determination is made at 210 as to whether the leakage current exceeds or meets a predetermined threshold. If not (NO at 210), the process proceeds to 212 where the measurement circuit 140 is deactivated and the process proceeds to again bias the sensing transistor(s) for TID exposure at 202. If the measured leakage current meets or exceeds the threshold (YES at 210), the integrated circuit is deactivated at 214. The deactivation of the IC at 214 in certain embodiments includes blowing a fuse, anti-fuse and/or setting a memory that state or combinations thereof such that the IC 100 is thereafter rendered inoperative, and may include initiating a controlled shutdown program for routine 118 to allow a limited number of processing cycles and/or a limited amount of time for the IC 100 to be safely shut down without the possibility of subsequent operation.

Figure 9:
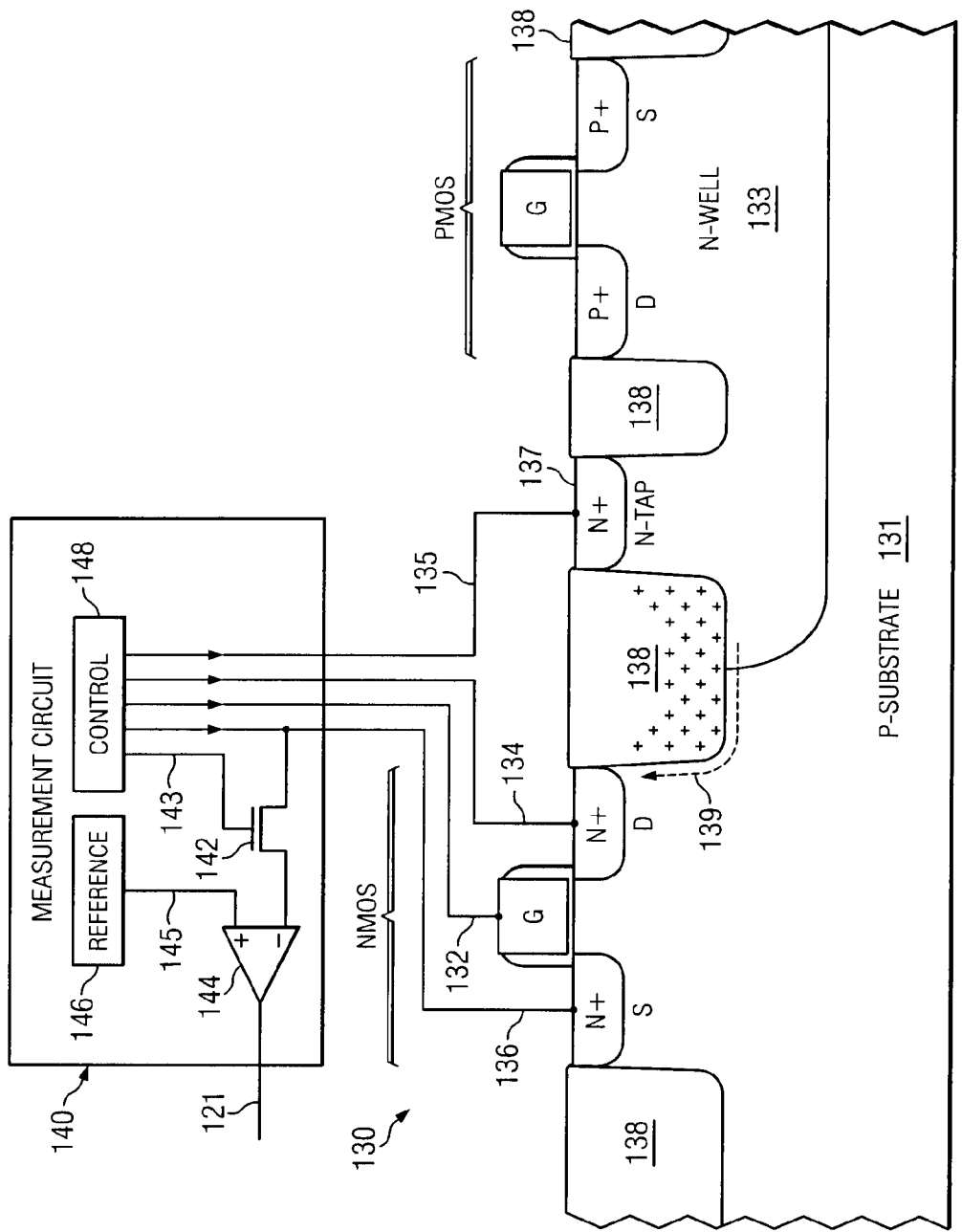
FIG. 9 is a partial schematic diagram illustrating an exemplary sensing circuit including an isolation structure formed between a well and the sensing transistor for sensing a leakage current from the well to the sensing transistor associated with TID exposure.

Referring to FIGS. 9-12, FIGS. 9 and 10 illustrate further embodiments in which the sensing circuitry includes a structure optimized to capture isolation leakage affected by total ionizing dose. As seen in FIG. 9, an NMOS sensing transistor 130 is formed with the drain alongside an STI isolation structure 138. The isolation structure 138 is formed between an N-well 133 and the sensing transistor 130, and the resulting sensing circuit allows sensing of a leakage current from the well 133 to the sensing transistor 130. Such embodiments can be used separately or in combination with the above-described examples in which sensing transistor source-drain leakage is sensed to detect total ionizing dose level. In this regard, the inventors have appreciated that another TID exposure detection mode is isolation leakage resulting from formation of parasitic channels connecting a transistor source or drain to a well to indicate the amount of charge accumulated in the isolation structure through TID. In one example, an NMOS transistor source or drain is formed in a P-well or P-substrate adjacent to a shallow trench isolation (STI), LOCOS or field oxide isolation structure, with an N-well along an opposite side of the isolation structure. Exposure of the isolation structure to ionic radiation can result in positive charge accumulation at the Si—$SiO_2$ interface associated with the isolation structure, thereby depleting or inverting the surface and creating a path 139 (FIG. 9) for leakage current to flow. Moreover, the use of wide-channel sensing transistors 130 (as seen in FIGS. 2 and 3 above) in combination with one or more such associated isolation structures 138 may enhance the sensitivity of the resulting sensing circuit to TID exposure.

Because such isolation leakage current is related to the amount of total ionizing dose, the sensing circuit 130 may include such an isolation structure(s) 138 alongside a source or drain of the sensing transistor(s) 130, with the controller 148 configured to bias the well 133, such as by applying a voltage to one or more taps 137 in the second mode, along with connection of the sensing transistor(s) 130 to the comparator circuit 144 to sense the isolation leakage current level for comparison with the threshold 146. In certain embodiments, this isolation leakage current can be maximized by using large-width structures as described above, and the transistor length L can be minimized or long-channel sensing transistor devices 130 can be used to reduce spurious results caused by source-drain leakage. In certain embodiments, moreover, the isolation structure width (e.g., left-to-right in the figure) is preferably minimized such that the lateral distance between the closest N+ drain of the sensing transistor 130 and the N-well 133 is minimized so as to maximize the leakage for a given amount of total ionizing dose. The same or similar design considerations could be employed in PMOS implementations.

In one possible implementation, the controller 148 biases the sensing transistor 130 in FIG. 9 "on" in the first mode (exposure mode) via signals 132, 134 and 136 to the gate, drain, and source. In the second mode, the controller 148 provides a positive bias to an N− tap 137 in the N-well 133, while applying a positive voltage to the gate 132 of the sensing transistor 130 (to turn transistor 130 "on"), with the source of the sensing transistor 130 connected to the inverting input of the comparator 144 via the pass gate 142 (pass gate 142 "on" for sensing). In this manner, any leakage current flowing from the N-well 133 to the drain of the sensing transistor 130 is compared by the comparator circuit 144 to the reference 146 for detection of total ionizing dose.

In another possible implementation, the controller 148 turns the sensing transistor 130 on in the first mode (positive voltage applied to the gate 132, with the source and drain grounded), and then turns the transistor 130 off (gate 132 grounded) and applies a positive voltage to the tap 137 via control line 135 with the pass gate 142 on in the second mode. In this case, the inverting input terminal of the comparator 144 receives a signal representing the leakage current flowing along the path 139 due to the charge accumulation in the isolation structure 138 as well as any source-drain leakage caused by charge accumulation in the gate dielectric of the transistor 130. In an alternate implementation, the sensing transistor 130 is turned off during the first mode, such that the sensed leakage current in the second mode is entirely or mostly attributable to charge accumulation in the isolation structure 138.

Figure 10:
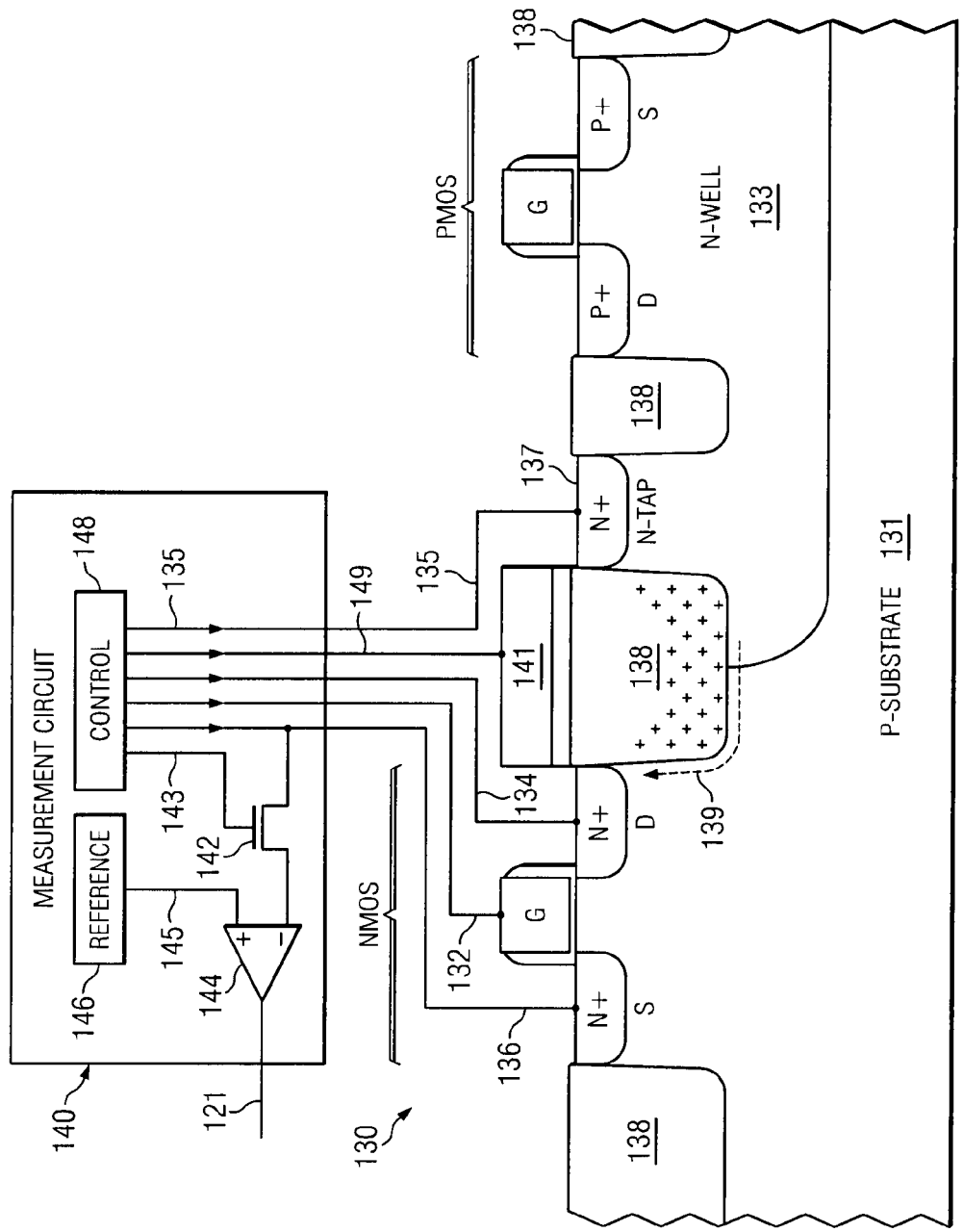
FIG. 10 is a partial schematic diagram illustrating a further embodiment including an isolation structure electrode formed above the sensing isolation structure for application of a bias during sensing.

FIG. 10 illustrates another embodiment in which an electrode 141 is formed above the sensing isolation structure 138 allowing the controller 148 to apply a bias via control line 149 during sensing in the second mode. Depending upon any integrated circuit design rules, an electrode layer 141 can be constructed of polysilicon (e.g., during transistor gate formation) and/or metallization structure over an intervening insulator above all or a portion of the isolation structure 138. In some implementations, longer P+ and/or N+ areas may facilitate moving the contacts away from the isolation structure 138. During sensing in the second mode, the isolation leakage path 139 can be modified or enhanced by application by the controller 148 of a voltage to the electrode 141. This biasing by the controller 148 facilitates detection of TID-induced leakage along the path 139, which might otherwise be too low for sensing, wherein the additional voltage applied to the electrode 141 via the control line 149 enhances the leakage during the second mode for comparison by the comparator circuit 144. In certain embodiments, moreover, the controller 148 can bias the isolation electrode 141 in the first mode in order to facilitate accumulation of more positive charge in the Si/SiO$_2$ interface near the isolation structure 138, thereby enhancing or magnifying the TID sensitivity of the sensing circuit 130.

Figure 11:
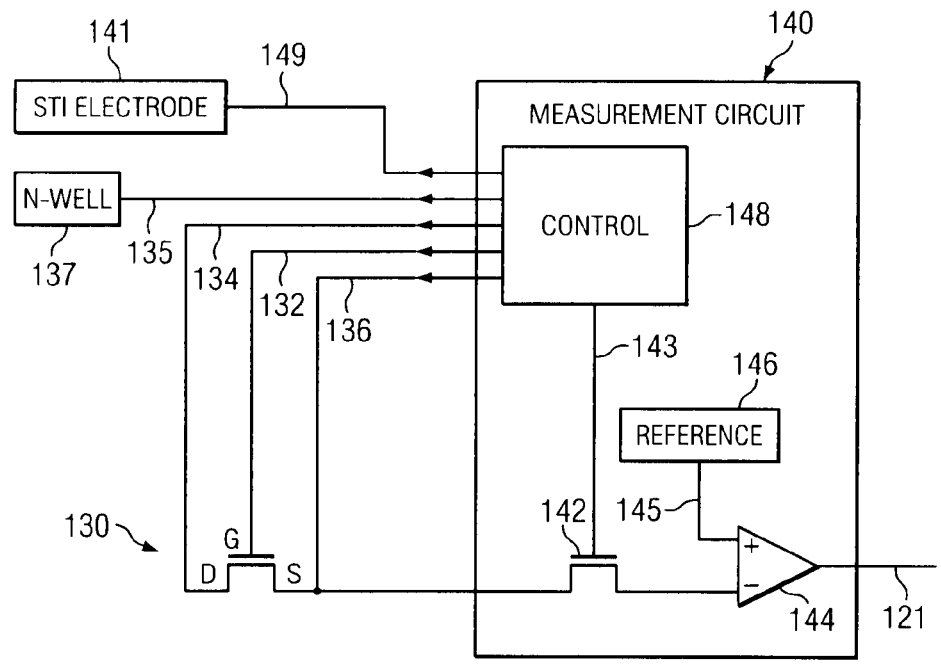
FIG. 11 is a schematic diagram illustrating the sensing circuit and measurement circuit a controller providing a bias to the well and to the isolation electrode.
Figure 12:
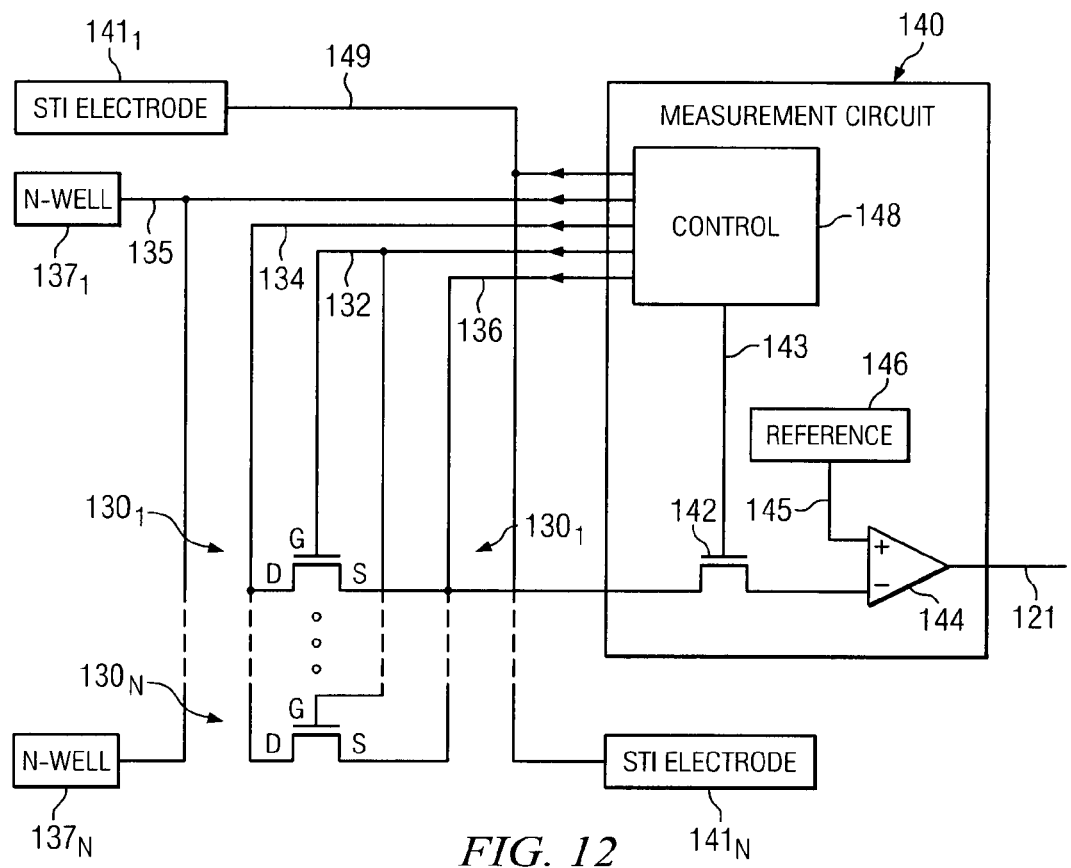
FIG. 12 is a schematic diagram illustrating a sensing circuit with multiple sensing transistors along with biasing for associated wells and isolation structure electrodes.

Referring also to FIGS. 11 and 12, FIG. 11 illustrates the sensing circuit 130 and measurement circuit 140 with the controller 148 providing a bias to the well 137 via control line 135 and also applying a bias to the isolation electrode 141 via the control line 149 using any of the first and second mode biasing techniques described above. Additional leakage current magnitude can be achieved as seen in FIG. 12 by using two or more such sensing structures 130, each having an associated well 137 biased via the control signal 135 by the controller 148. Moreover, each of the sensing circuit 130 may also include an associated isolation electrode structure 141 which can be selectively biased via control line 149 by the controller 148.

Figure 13:
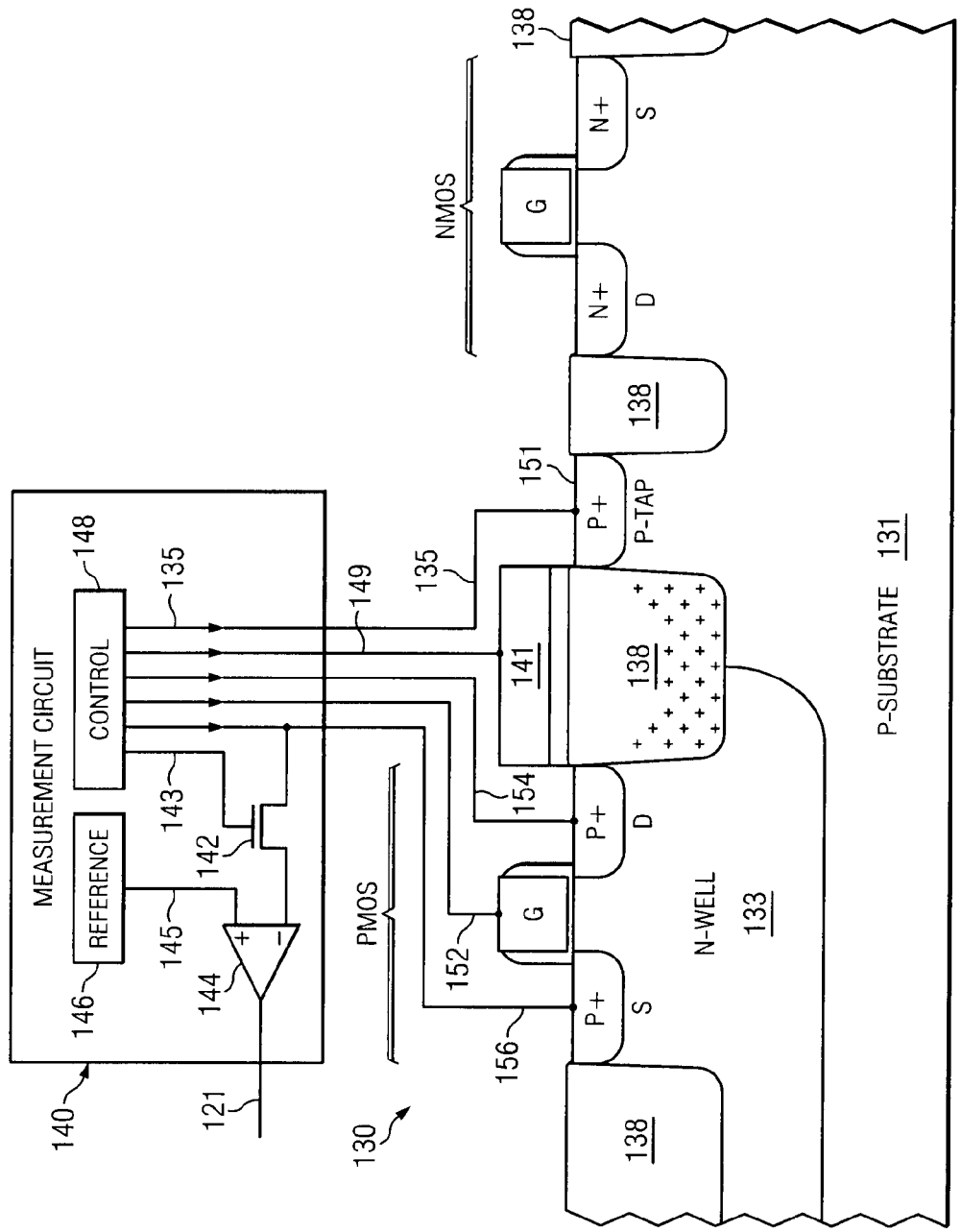
FIG. 13 is a partial schematic diagram illustrating another exemplary sensing circuit including a PMOS sensing transistor separated from a well or P-substrate by a sensing isolation structure.

Referring now to FIG. 13, other possible sensing circuits 130 could include one or more actively biased PMOS transistors, in which TID exposure will reduce leakage due to accumulated charge in either or both of the sensing transistor gate dielectric and/or an associated isolation structure 138. Thus, a sensed parameter of such a single PMOS sensing transistor 130 (or groups thereof), including without limitation leakage current, can be compared with a reference 146 using a comparator circuit 144 or other suitable circuitry for selective detection of TID exposure at or above a predetermined threshold level. In the example of FIG. 13, a PMOS sensing transistor 130 has a source 156 connected through a pass gate 142 to the inverting input of a comparator circuit 144, and the controller 148 may provide biasing signals to the gate 152, the drain 154 and/or the source 156 for exposure in a first mode and sensing in a second mode.

The exemplary sensing circuit 130 in FIG. 13 includes a sensing isolation structure 138 separating the sensing transistor 130 from a P-well (not shown) or from a P-substrate 131, where the exposure of the PMOS gate dielectric to ionic radiation will reduce the leakage current of the PMOS sensing transistor 130, and radiation exposure of the separating isolation structure 138 will reduce leakage between the sensing PMOS transistor 130 and the P-substrate 131. As described above in connection with FIGS. 10 and 11, the controller 148 may selectively bias the sensing PMOS transistor 130 and/or a sensing isolation electrode structure 141 during an exposure mode and/or a sensing mode. For instance, the controller 148 may selectively bias a p-type tap 151 in the P-substrate 131 via line 135 during sensing, and/or may provide suitable biasing signals to the isolation electrode 141 and the sensing transistor terminals during exposure and sensing modes by a variety of techniques similar (or complementary) to those described above in the NMOS sensing transistor case. In this manner, a suitable signal is provided to the comparator 144 via the pass gate 142 indicative of leakage current between the source and drain of the PMOS sensing transistor 130 and/or leakage current along the edge of the sensing isolation structure 138 for comparison to a reference 146 to determine whether the integrated circuit 100 has been exposed to a predetermined threshold level of TID.

Figure 14:
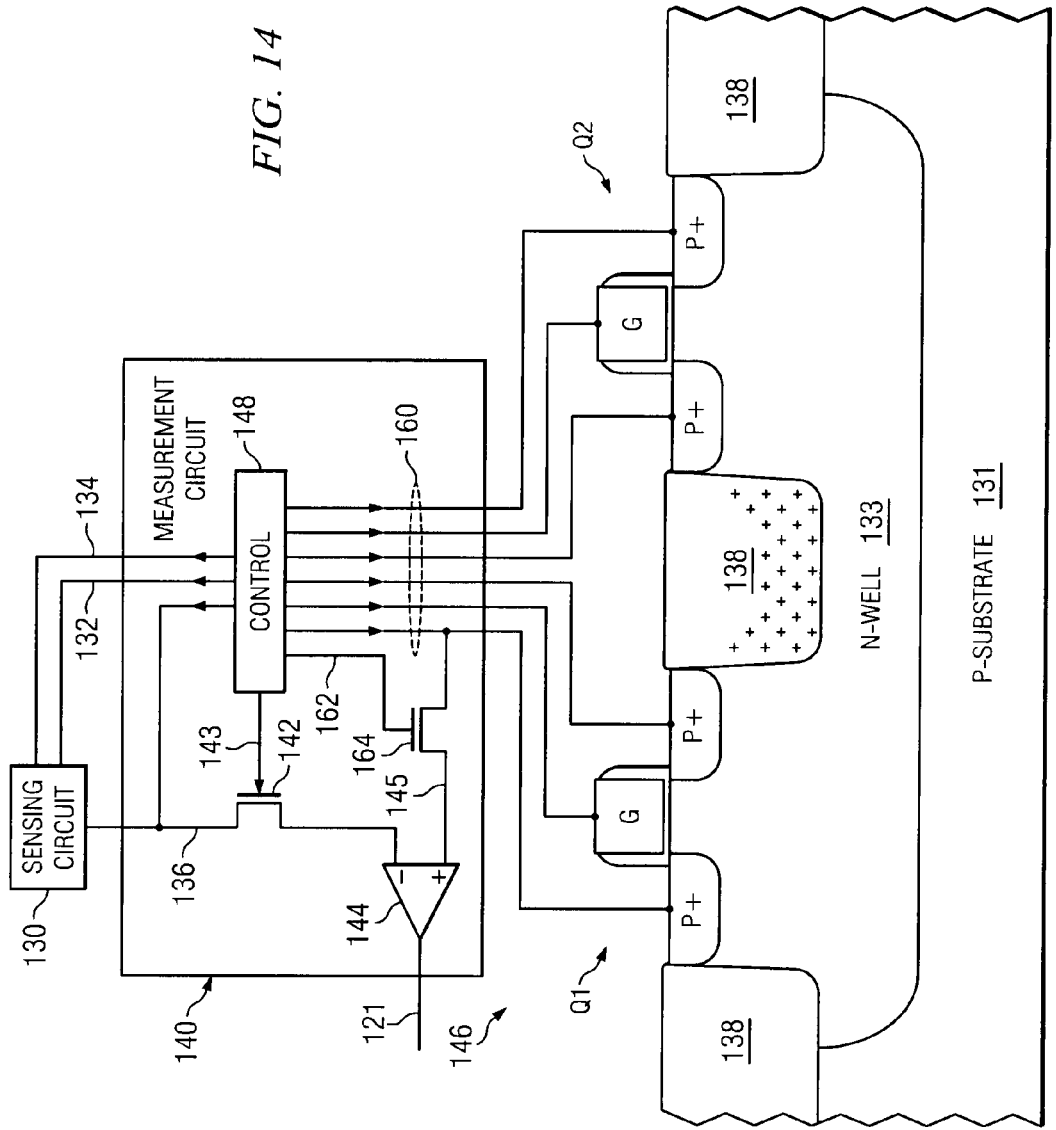
FIG. 14 is a partial schematic diagram illustrating an exemplary dual-PMOS comparator reference circuit.

In accordance with further aspects of the present disclosure, the sensing circuit 130 in certain embodiments may be constructed using one or more components (e.g., transistors) having a TID level exposure characteristic that varies in one direction with increased exposure, while the reference circuit 146 is constructed using one or more components having a TID level exposure characteristic that varies in the opposite direction. FIG. 14 illustrates an exemplary dual-PMOS comparator reference circuit 146 which may be used in any of the above embodiments, in particular, those employing NMOS sensing transistors 130. In this example, exposure to ionic radiation will reduce the leakage current between first and second PMOS transistors Q1 and Q2 by accumulation of charge in the isolation structure 138 separating the transistors. The isolation structure 138 separating the two transistors Q1 and Q2 may be constructed using STI, LOCOS, or other field oxide formation techniques, with an N-well 133 formed in a P-substrate 131. The controller 148 provides control signals 160 to the various terminals of the PMOS transistors Q1 and Q2 during exposure and sensing modes, with a source or drain of the first transistor Q1 connected via pass gate 164 to the non-inverting input terminal of the comparator 144 to provide a reference for comparison with a sensed parameter of the sensing circuit 130. In one possible mode of operation, the controller provides a positive bias to one of the source or drain terminals of the second transistor Q2 in the sensing (second) mode while maintaining the gate terminals of both transistors low (PMOS transistors on). In this manner, any leakage from transistor Q2 to Q1 is sensed by the comparator 144 and compared with the signal from the sensing circuit 130. Since the leakage of the PMOS structures Q1 and Q2 and the leakage therebetween will stay the same or go down with continuing ionic radiation of the integrated circuit 100, the structure 146 can be used as a reference for the TID detection comparator 144.

In combination with one or more NMOS sensing transistors in the sensing circuit 130, the PMOS reference circuit 146 provides a low-cost, simple to implement reference for the above-described TID detection concepts. Moreover, such a combination may advantageously provide PMOS drift in the opposite direction (higher TID, lower leakage) as that of the sensing transistors 130 (higher TID, higher leakage), whereby the combined usage of Anne Moss sensing transistor structures 130 and PMOS reference circuitry 146 can maximize the sensing signal amplitude, as TID exposure will never shift the reference in the wrong direction, thus ensuring that the integrated circuit 100 will not be operational if the predetermined level of TID exposure is experienced. In other possible implementations of this concept, the sensing circuit 130 can be constructed using PMOS transistors, while the reference circuit 146 is constructed using NMOS transistors, with the measurement circuitry operative to compare leakage current characteristics or other operational parameters of the reference circuit 130 and the reference circuit 146 (e.g., using a comparator 144 as discussed above) for threshold TID exposure level detection to provide the signal 121 to the deactivation circuit 150.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. An integrated circuit, comprising:
a sensing circuit with at least one sensing transistor including a gate, a drain, and a source;
a comparator circuit including a first input terminal connected to a reference, a second input terminal connected to the source of the at least one sensing transistor through a pass gate, and an output providing an output signal;
a controller coupled with the at least one sensing transistor and with the pass gate, the controller being operative in a first mode to turn the at least one sensing transistor on and to turn the pass gate off, and the controller being operative in a second mode to turn the at least one sensing transistor off and to turn the pass gate on; and
a deactivation circuit receiving the output signal from the comparator circuit and operative to selectively disable operation of a user circuit of the integrated circuit responsive to the output signal from the comparator circuit indicating that a total ionizing dose experienced by the integrated circuit is greater than or equal to a threshold value.

2. The integrated circuit of claim 1, wherein the at least one sensing transistor is an NMOS transistor, wherein the controller is operative in the first mode to couple the gate to a positive supply voltage while grounding the drain and the source to facilitate total ionizing dose exposure of the at least one sensing transistor while the pass gate is off, and wherein the controller is operative in the second mode to couple the drain with the positive supply voltage while grounding the gate to facilitate sensing of off-state leakage current of the at least one sensing transistor by the comparator circuit via the pass gate.

3. The integrated circuit of claim 1, wherein the controller alternates between the first mode and the second mode periodically.

4. The integrated circuit of claim 1, wherein the sensing circuit comprises a plurality of sensing transistors, each including a gate, a drain, and a source, wherein the second input terminal of the comparator circuit is connected to the sources of the plurality of sensing transistors through at least one pass gate, wherein the controller is operative in the first mode to turn the plurality of sensing transistors on and to turn the at least one pass gate off, and wherein the controller is operative in the second mode to turn the plurality of sensing transistors off and to turn the at least one pass gate on.

5. The integrated circuit of claim 4, wherein the plurality of sensing transistors are NMOS transistors, wherein the controller is operative in the first mode to couple the gates of the plurality of sensing transistors to a positive supply voltage while grounding the drains and the sources of the plurality of sensing transistors to facilitate total ionizing dose exposure of the plurality of sensing transistors while the at least one pass gate is off, and wherein the controller is operative in the second mode to couple the drains of the plurality of sensing transistors with the positive supply voltage while grounding the gates of the plurality of sensing transistors to facilitate sensing of off-state leakage current of the plurality of sensing transistors by the comparator circuit via the at least one pass gate.

6. The integrated circuit of claim 5, comprising a plurality of fuses individually coupled between a source of a corresponding one of the plurality of sensing transistors and the at least one pass gate.

7. The integrated circuit of claim 4, comprising a plurality of pass gates individually coupled between a source of a corresponding one of the plurality of sensing transistors and the second input terminal of the comparator circuit, and wherein the controller is operative in the second mode to turn at least one of the plurality of pass gates on to connect corresponding ones of the plurality of sensing transistors to the second input terminal of the comparator circuit.

8. The integrated circuit of claim 1, wherein the deactivation circuit is operative to provide an interrupt to cause the user circuit of the integrated circuit to initiate a controlled shutdown responsive to the output signal from the comparator circuit indicating that the sensed parameter of the at least one sensing transistor is greater than or equal to the reference.

9. The integrated circuit of claim 1, wherein the sensing circuit comprises at least one sensing isolation structure formed in a substrate between a well and a side of the drain or the source of the at least one sensing transistor, wherein the controller is operative in the second mode to provide a bias to the well to allow the comparator circuit to sense a leakage current from the well to the at least one sensing transistor.

10. The integrated circuit of claim 9, wherein the sensing circuit comprises an isolation structure electrode formed above at least a portion of the sensing isolation structure, and wherein the controller is operative in at least one of the first and second modes to bias the isolation structure electrode.

11. The integrated circuit of claim 10, wherein the sensing circuit comprises a plurality of sensing transistors, each including a gate, a drain, a source, at least one associated sensing isolation structure formed in the substrate between a well and a side of the corresponding drain or the corresponding source, and an isolation structure electrode formed above at least a portion of the associated sensing isolation structure, and wherein the controller is operative in the second mode to provide a bias to the wells and to bias the isolation structure electrodes.

12. The integrated circuit of claim 9, wherein the sensing circuit comprises a plurality of sensing transistors, each including a gate, a drain, a source, and at least one associated sensing isolation structure formed in the substrate between a well and a side of the corresponding drain or the corresponding source, and wherein the controller is operative in the second mode to provide a bias to the wells.

13. The integrated circuit of claim 1, wherein the reference is robust to total ionizing dose.

14. The integrated circuit of claim 1, wherein the at least one sensing transistor is an NMOS transistor, wherein the reference comprises first and second PMOS transistors separated by a reference isolation structure, with a source or drain of the first PMOS transistor coupled to the first input terminal of the comparator circuit through a reference pass gate, wherein the controller is operative in the second mode to turn the first and second PMOS transistors on and to apply a bias to a source or drain of the second PMOS transistor to allow the comparator circuit to sense a leakage current from the first PMOS transistor to the second PMOS transistor.

15. The integrated circuit of claim 1, wherein the reference is powered off during the first mode.

16. The integrated circuit of claim 1, wherein the at least one sensing transistor is a PMOS transistor.

17. An integrated circuit, comprising:
a sensing circuit with at least one sensing transistor including a gate, a drain, and a source, the at least one sensing transistor having a channel width greater than a largest channel width of transistors in a user circuit of the integrated circuit;
a comparator circuit including a first input terminal connected to a reference, a second input terminal connected to the source of the at least one sensing transistor, and an output providing an output signal; and
a deactivation circuit receiving the output signal from the comparator circuit and operative to selectively disable operation of the user circuit responsive to the output signal from the comparator circuit indicating a total ionizing dose experienced by the integrated circuit is greater than or equal to a threshold value.

18. The integrated circuit of claim 17, comprising a plurality of sensing transistors, each including a gate, a drain, and a source, wherein each sensing transistor has a channel width greater than the largest channel width of transistors in the user circuit, and wherein the second input terminal of the comparator circuit is connected to the sources of the plurality of sensing transistors.

19. The integrated circuit of claim 18, wherein the plurality of sensing transistors are NMOS transistors, and wherein the comparator circuit is operative to compare sense an off-state leakage current of the plurality of sensing transistors.

20. An integrated circuit, comprising:
a sensing circuit with at least one sensing transistor including a gate, a drain, a source, and at least one sensing isolation structure formed in a substrate between a well and a side of the drain or the source of the at least one sensing transistor;
a comparator circuit including a first input terminal connected to a reference, a second input terminal connected to the source of the at least one sensing transistor, and an output providing an output signal;
a controller operative to provide a bias to the well to allow the comparator circuit to sense a leakage current from the well to the at least one sensing transistor; and
a deactivation circuit receiving the output signal from the comparator circuit and operative to selectively disable operation of the user circuit responsive to the output signal from the comparator circuit indicating that a total ionizing dose experienced by the integrated circuit is greater than or equal to a threshold value.

21. The integrated circuit of claim 20, wherein the sensing circuit comprises an isolation structure electrode formed above at least a portion of the sensing isolation structure, and wherein the controller is operative to bias the isolation structure electrode.

22. The integrated circuit of claim 20, wherein the at least one sensing transistor is an NMOS transistor.

23. The integrated circuit of claim 20, wherein the at least one sensing transistor is a PMOS transistor.

24. The integrated circuit of claim 20, wherein the at least one sensing transistor is an NMOS transistor, wherein the reference comprises first and second PMOS transistors separated by a reference isolation structure, with a source or drain of the first PMOS transistor coupled to the first input terminal of the comparator circuit through a reference pass gate, wherein the controller is operative to turn the first and second PMOS transistors on and to apply a bias to a source or drain of the second PMOS transistor to allow the comparator circuit to sense a leakage current from the first PMOS transistor to the second PMOS transistor.

25. The integrated circuit of claim 20, wherein the reference is robust to total ionizing dose.

26. The integrated circuit of claim 20, wherein the reference is powered off during the first mode.

* * * * *